3,493,783
SOLID STATE SWITCH CIRCUITS
James Peter Till, Camp Hill, Pa., assignor to AMP Incorporated, Harrisburg, Pa.
Filed Jan. 11, 1967, Ser. No. 608,649
Int. Cl. H03k *17/56*
U.S. Cl. 307—252 2 Claims

ABSTRACT OF THE DISCLOSURE

A switching circuit having a pluggable unit containing all the components necessary making the switch operative in either a normally open circuit mode or a normally closed circuit mode, the mode being determined by the orientation of the pluggable unit.

This invention relates to an electrical switch circuit which has no moving parts, which utilizes standard solid state components, and which is capable of continuous use in a totally sealed package.

Most switch apparatus in use today for connecting and disconnecting electrical circuits which carry signals of substantial voltage or current include contacts which are mechanically driven to effect switch operation. Even those devices which employ solid state power switching elements usually have contacts which are opened and closed for providing switch control signals. The presence of contacts in a switch and the presence of a mechanical driving mechanism may be undesirable for a number of reasons. First of all, this sort of structure has a very definite and finite life; it is expected to wear out. With this limitation, the switch may be expected to change its characteristics as it is used. Having physical contacts and a driving mechanism also means that the switch apparatus is subject to contamination from the environment of use. It also means that it is subject to being influenced by environmental forces such as acceleration, inertia, shock, vibration, and the like. With respect to certain switch applications wherein the switch must be placed in an environment having moisture, explosive gasses or acids, the use of mechanical contacts and driving mechanism means that the switch must be very carefully sealed. In explosive environments, this sealing becomes extremely costly and raises yet another problem which affects even solid state switch devices. This problem is one of heat. If the switch package must be sealed for any reason and contains elements such as resistors, transistors, SCR's, or the like which generate heat, the heat must be dissipated by the package before it rises to a value which will materially affect the circuit or the components therein.

It is an object of the present invention to provide a solid state electrical switch and control circuit therefor which is capable of switching signals of power level and at the same time is capable of continuous operation in a totally sealed container.

It is a further object to provide a switch for electrical circuits which has no moving parts, contacts, mechanical driving mechanism, or the like and thus may be expected to operate reliably for long periods of time in adverse environments.

It is still a further object of the invention to provide an electrical switch having relatively few components which are each standard, relatively inexpensive, and reliable.

It is another object of the invention to provide a control circuit for solid state switching applications which may be driven by a simple AC or DC signal of relatively low voltage and which inherently generates little heat.

It is still another object of the invention to provide a solid state switch with a pluggable unit the orientation of which determines the normal mode of conduction of the switch.

The present invention attains the foregoing objectives through the use of a power switching element such as a Triac placed in series with an AC power supply and a load and controlled in blocking or conducting states by a control circuit connected across the power line to the gate electrode of the element and externally supplied by a control signal. A Triac is a symmetrical bi-directional triode thyristor and is gate controlled by positive or negative triggers from a blocking to a conducting state for either polarity of applied voltage. The control circuit of the invention includes a further solid state element which may be either a transistor or an SCR connected to the gate electrode of the Triac and to the drive circuit through a diode bridge capable of supplying gate current in a single direction with respect to the control element, notwithstanding polarity changes in the supply and load current. The control element is separately initiated to a blocking or conducting state to control the Triac from a low voltage DC control signal which may be directly supplied from a control signal at a remote point or may be derived from an AC control signal through a transformer and half-wave rectifier in the control path of the control element. In accordance with the invention, the circuit may be arranged for normally closed or normally opened operation and in embodiment a novel component and circuit plug is provided to permit a change in operation. All of the components are standard readily available elements and all are relative inexpensive, rugged and reliable.

Figure 1:
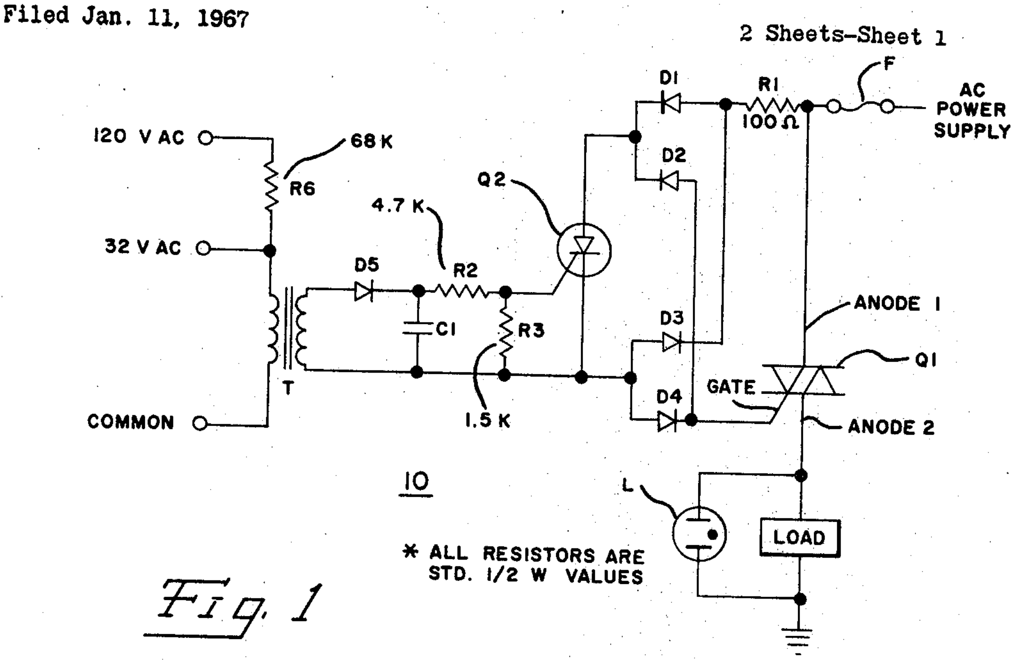
FIGURE 1 is a schematic diagram showing the circuit of the invention in an AC switch embodiment for normal open operation.
Figure 2:
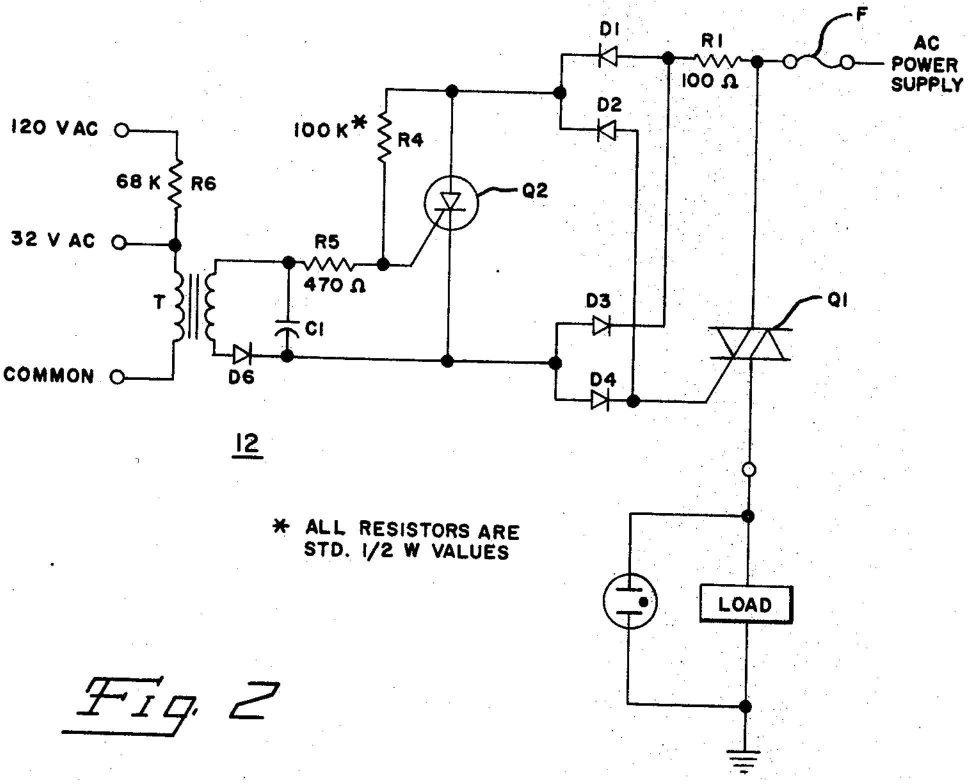
FIGURE 2 is a schematic diagram showing the circuit of the invention in an AC switch embodiment for normally closed operation.

Referring now to FIGURES 1 and 2, the circuit 10 represents a normally opened switch embodiment and the circuit 12 represents a normally closed switch embodiment. In each circuit, the functional objective is to controllably connect a power supply to, or disconnect such supply, from a load. In each embodiment, the switching element Q1 is a triac which is identically connected with its anode circuit in series with the load and the power supply. In each circuit there is a control circuit connected between the gate terminal of the triac and a lead connected to the supply. When the control path is closed and conducting, Q1 is caused to conduct and when the control path is opened to block current flow, Q1 is placed in a blocking state. In each embodiment, a control element Q2, which may be an SCR as shown, is controlled to conduct or block in accordance with the presence or absence of a signal to the gate thereof developed from an external source. In the circuit 10 which is normally open, the presence of an input control signal causes Q2 to conduct to effectively close the circuit path for conduction to the gate terminal of Q1. In circuit 12, the control element Q2 is held on by a signal developed from the supply in the absence of a control signal and the presence of a control signal is made to gate Q2 off which, in turn, operates to cause Q1 to go into a blocking condition and disconnect the supply from the load.

In each of the circuits, the supply is shown as an AC power supply which may be typically a 120 volt, 60 cycle, line supply. There is connected in the supply lead a fuse shown as F having characteristics chosen to protect the circuit and the load against faults. A lamp L is provided to initiate switch generation and is preferably a neon bulb of selected characteristics to be lighted by load current and voltage, and to be extinguished if there is no load current and voltage.

In the control circuit for each embodiment, there is a resistor R1 which is selected to limit the current drawn by the triac gate circuit to a value sufficient to cause conduction thereof. For a 120 volt, 60 cycle supply, R1 may be in the range of 100 ohms to limit the gate current to between 100 and 400 milliamps. The diodes D1, D2, D3, and D4 of the bridge for each embodiment are selected to operate in this range of current and to effectively pass or block current flow in accordance with their connection in the circuit. The control element Q2, for each embodiment, which is shown as an SCR is selected for the foregoing rating and is connected as shown with the anode and cathode connected by leads to the diode bridge in a manner to pass or block current flowing in the same direction, irregardless of the polarity of the supply signal. The gate of Q2 is connected to a control signal supply which provides a gating signal thereto.

With respect to the normally open circuit 10, the presence of a DC signal causes conduction of Q2 which then operates to cause conduction of Q1. This control signal is developed through a limiting resistor R2 and across a bias resistor R3 tied between the gate and cathode of Q2.

With respect to the circuit 12, the presence of a DC control signal of opposite polarity operates to cancel a gating signal on Q2 and to cause it to block, thus causing Q1 to block. In the circuit 12, a bias signal is developed from the supply across a resistor R4 tied between the anode and gate terminal of Q2. The value of R4 is chosen so that Q2 will be caused to conduct continuously. The resistor R5 serves to limit current from a negative control signal which operates to block current flow through R4 by cancelling the bias causing Q2 to conduct, and thereby turn Q2 and Q1 off.

In circuit 10 the control supply includes a diode D5 and a capacitor C1 connected to rectify and filter an AC control signal developed from the secondary of a transformer T to provide the DC control signal to the gate electrode of Q2. In a typical embodiment, this supply voltage may be either 32 or 120 volts AC connected across the primary of transformer T with a resistor R6 connected between the upper terminals to drop the 120 volts supply to a 32 volt primary level. The secondary of T is connected as shown to develop the control signal.

The contact supply for circuit 12 is rectified by the diode D6 with filtering by capacitor C1.

Figure 3:
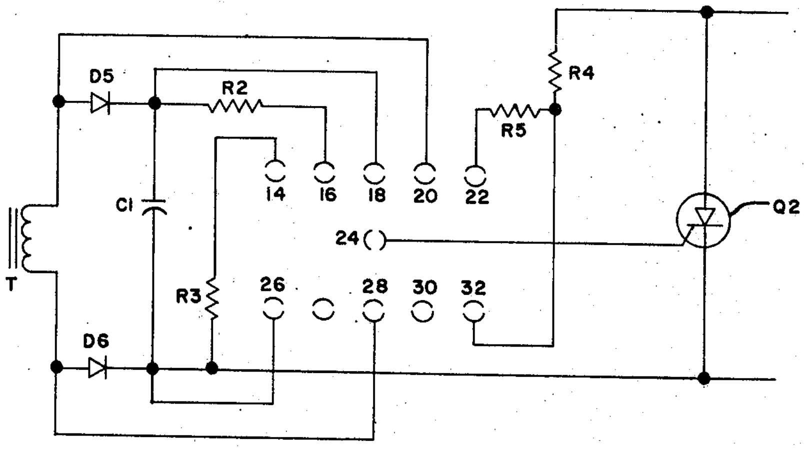
FIGURE 3 is a schematic diagram showing a control circuit and components for both normally open and normally closed operation.

FIGURE 3 shows a portion of the control circuit which contains all components necessary for either the normally opened circuit 10 or the normally closed circuit 12. The components are connected to terminals 14–30. When the terminals 14, 16, 24, 26 and 28 are connected, the circuit will operate as normally open switch; requiring the presence of a control signal input to effect conduction in Q2 and Q1. When the terminals 18, 20, 22 and 24, 30, 32 are connected, the circuit will operate as a normally closed switch; requiring the presence of a control signal input to cause Q2 to block in the manner heretofore described. In this way, an identical circuit can be manufactured and made to operate either in a normally open or normally closed mode, dependent only upon a selected connection of several fixed contacts.

Figure 4:
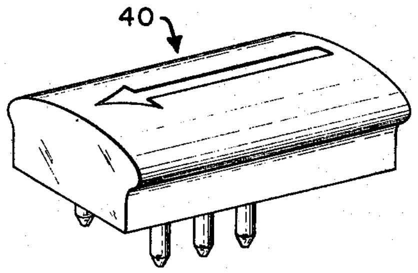
FIGURES 4 and 5 show, respectively, perspective top and bottom views of the component plug for the circuit of FIGURE 3.
Figure 5:
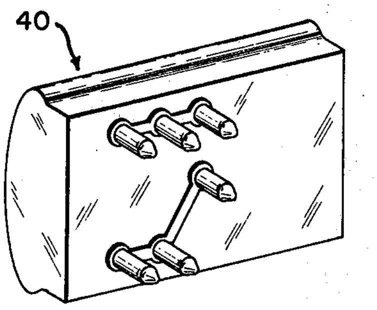

As a preferred embodiment to be incorporated into a package containing the circuit of FIGURE 3, it is contemplated that a plug member shown as 40 in FIGURE 4 may be utilized to carry buses arranged to effect a selected connection of the terminals 14–32, dependent upon which way it is installed. With respect to the plug 40 the package would have a normally closed indication to the right and a normally open indication to the left. FIGURE 5 shows terminal pins which are bused together so that when the plug is installed in position with the arrow to the left, it will effect a normally closed mode of switch operation. When the plug is rotated 180° and plugged into the circuit, it will effect the normally open mode of switch operation. The plug 40 may be of a plastic material having a printed circuit card on the bottom thereof with printed circuit busing between male or female terminals, pins or sockets which are made to mate with terminals, pins or sockets connected to the circuit.

In the circuits 10 and 12 the control element Q2 is shown as an SCR. It is contemplated that a p-n-p transistor may be utilized in place of the SCR. If a transistor is used for the circuit 10 the connection from R2 and R3 to the gate of Q2 would be replaced by a connection from such resistors to the base of the transistor with the emitter thereof connected to the lead going to the gate terminal of Q1 through the path including diode D4. The collector thereof would be tied to the lead connected to D1 and R1.

In an actual embodiment utilizing a transistor as the control element, the unit employed was a 2N3440. In an actual embodiment utilizing an SCR, the unit employed was a C106B–4 manufactured by General Electric Co. In actual embodiments for 10 and 12 the Triac was a C46B, General Electric Co. The diodes D1 and D6 were B–200 units manufactured by the Mallory Co. The resistors R2 and R3 were 4700 and 1500 ohms, respectively, R4 and R5 were 100,000 and 4,700 ohms respectively. The resistor R6 was 68,000 ohms. The capacitor C1 was rated at 2.7 mfd., 35 volts. The circuit was utilized to drive a load requiring about 120 volts AC, 60 cycles at 10 amps R.M.S.

Having now disclosed and described my invention in a mode intended to enable its preferred practice, I define it through the appended claims.

I claim:

1. In a switch circuit for switching AC power to a load, a solid state switch element capable of conducting or blocking current flow of positive or negative polarity inserted between an AC power supply and a load, said element having a gate terminal connected to said supply to provide a gate signal of the polarity of said supply means in said circuit to develop a unidirectional current from said gate signal, a control element connected to said means and operable to block or conduct, to cause said switch element to block or conduct, a control signal source operable to gate said control element to blocking or conducting states whereby to control said switch element, and plug connection means arranged to be plugged into said circuit in first orientation to cause said control element to block in the absence of a control signal and to conduct in the presence of a control signal for normally open switch operation, and plugged into said circuit in second orientation to cause said control element to conduct in the absence of a control signal and to block in the presence of a control signal for normally closed switch operation.

2. In a switch device for providing a controlled connection between a load and a power supply, a first solid state element capable of blocking or conducting current to a load from a supply responsive to a control signal imposed on a gate terminal thereof, a second solid state element capable of blocking or conducting current to said gate terminal in response to a control signal imposed on a terminal thereof, full wave rectifier means including elements having unidirectional current characteristics connected between said first and second solid state elements to supply current in one direction to said second element from said supply and from said gate terminal, means to provide a control signal, first means for developing a voltage in the absence of said control signal to cause said second element to conduct and thereby cause said first element to conduct and provide normally closed switch operation, second means for causing said second element to be blocked in the absence of said control signal to cause said first element to be blocked and provide normally open switch operation, and pluggable circuit connection means for selectively connecting one of said first and said second means in the circuit while disconnecting the other to provide the desired type of switch operation, comprising a plug member carrying plural terminal pins, buses on said plug member to effect selected connections among said terminal pins, and indicia on the plug member to indicate the orientations associated with normally closed switch operation and normally open switch operation, respectively.

References Cited

UNITED STATES PATENTS 3,161,751 12/1964 Pusch et al. ---------- 200—166
3,328,606 6/1967 Pinckaers.
3,381,226 4/1968 Jones et al. ---------- 307—305

OTHER REFERENCES

G.E. SCR Manual, p. 51, Fig. 4.13, copyright March 1964.

DONALD D. FORRER, Primary Examiner

B. P. DAVIS, Assistant Examiner

U.S. Cl. X.R.

307—303, 305, 321